United States Patent
Elenes

(10) Patent No.: US 7,339,503 B1
(45) Date of Patent: Mar. 4, 2008

(54) ADAPTIVE ASYNCHRONOUS SAMPLE RATE CONVERSION

(75) Inventor: Javier Elenes, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/536,841

(22) Filed: Sep. 29, 2006

(51) Int. Cl.
*H03M 7/00* (2006.01)

(52) U.S. Cl. .......................... 341/61; 341/60; 381/104; 381/63

(58) Field of Classification Search ............. 341/60–65
See application file for complete search history.

(56) References Cited

U.S. PATENT DOCUMENTS

| | | | |
|---|---|---|---|
| 6,590,510 B2 | 7/2003 | Wong | 341/61 |
| 6,772,181 B1 * | 8/2004 | Fu et al. | 708/290 |
| 7,203,718 B1 * | 4/2007 | Fu et al. | 708/622 |

* cited by examiner

*Primary Examiner*—Lam T. Mai
(74) *Attorney, Agent, or Firm*—Dicke, Billig & Czaja, PLLC

(57) ABSTRACT

A system including a buffer, a feedback loop configured to generate a fractional delay from a ratio of a first number of samples written into the buffer to a second number of samples read from the buffer, and a variable fractional delay filter configured to generate an output sample using a plurality of input samples and the fractional delay is provided.

23 Claims, 9 Drawing Sheets

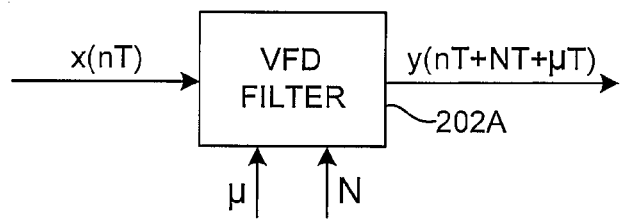
Fig. 3A
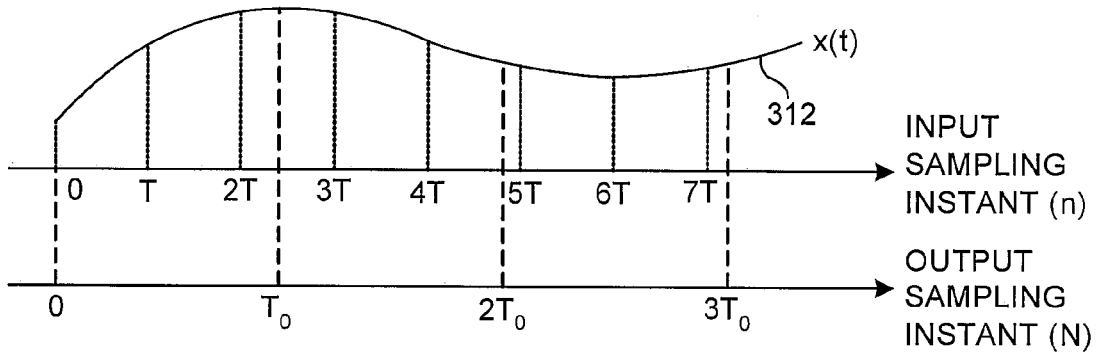
Fig. 3B
| OUTPUT INDEX K | INTEGER DELAY $N_K$ | SAMPLES TO READ | FRACTIONAL DELAY $\mu_K$ |
|---|---|---|---|
| 0 | 0 | 0 | 0 |
| 1 | 2 | 2 | 0.4 |
| 2 | 4 | 2 | 0.8 |
| 3 | 7 | 3 | 0.2 |
Fig. 3C

ADAPTIVE ASYNCHRONOUS SAMPLE RATE CONVERSION

BACKGROUND

Radio frequency (RF) communications devices are used in a wide variety of applications such as cellular or mobile telephones, cordless telephones, personal digital assistants (PDAs), computers, radios and other devices that transmit or receive RF signals. Communications devices may operate according to different standards or conventions. For example, different communications devices may process digital audio signals with different sample rates. It would be desirable to be able to for communications devices to be able to process digital audio signals with different sample rates without regard to whether the sample rates are synchronous or asynchronous.

SUMMARY

According to one exemplary embodiment, a system including a buffer, a feedback loop configured to generate a fractional delay from a ratio of a first number of samples written into the buffer to a second number of samples read from the buffer, and a variable fractional delay filter configured to generate an output sample using a plurality of input samples and the fractional delay is provided.

In another exemplary embodiment, a method performed by an integrated communication device is provided. The method includes generating a fractional delay from a ratio of a first number of samples written into a buffer synchronously with a first clock signal to a second number of samples read from a buffer synchronously with a second clock signal and generating an output sample using a plurality of input samples and the fractional delay.

In further exemplary embodiment, a communications device including radio frequency (RF) circuitry configured to interface with an antenna, signal processing circuitry coupled to the RF circuitry and including resampler, and a buffer is provided. The resampler includes a feedback loop configured to generate a fractional delay from a ratio of a first number of samples written into the buffer to a second number of samples read from the buffer and a variable fractional delay filter configured to generate an output sample using a plurality of input samples and the fractional delay.

In another exemplary embodiment, a communications system including a communications device, an antenna coupled to the communications device, and an input/output system configured to communicate with the communications device is provided. The communications device includes communications circuitry, signal processing circuitry coupled to the communication circuitry and including resampler, and a buffer. The resampler includes a feedback loop configured to generate a fractional delay from a ratio of a first number of samples written into the buffer to a second number of samples read from the buffer and a variable fractional delay filter configured to generate an output sample using a plurality of input samples and the fractional delay.

BRIEF DESCRIPTION OF THE DRAWINGS

FIGS. 3A-3C are diagrams illustrating one embodiment of the operation of a variable fractional delay filter.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As described herein, embodiments of integrated low power communications devices are provided for use in receiving and/or transmitting radio-frequency (RF) signals or signals from other frequency bands. The embodiments include an adaptive asynchronous sample rate converter configured to perform sample rate conversion between asynchronous sample rates and track any frequency variation between input and output sampling clocks. In embodiments with a transmitter, the communications device performs sample rate conversion between digital input signals (e.g., digital audio input signals) that are synchronous to an input clock signal and digital output signals that are synchronous to an output clock signal where the input and the output clock signals are asynchronous. The digital output signals may be used to generate analog output signals for transmission (e.g., analog audio RF output signals). In embodiments with a receiver, the communications device performs sample rate conversion between digital input signals that are synchronous to an input clock signal and digital output signals (e.g., a digital audio output signal) that are synchronous to an output clock signal where the input and the output clock signals are asynchronous. The digital input signals may be generated from received analog input signals (e.g., analog audio RF input signals).

The communications devices described herein may be used in a wide variety of integrated communications systems. Although terrestrial RF broadcast and receive communications devices, e.g., FM and AM communications devices, are described herein, these communications devices are presented by way of example. In other embodiments, other broadcast bands may be used.

Figure 1A:
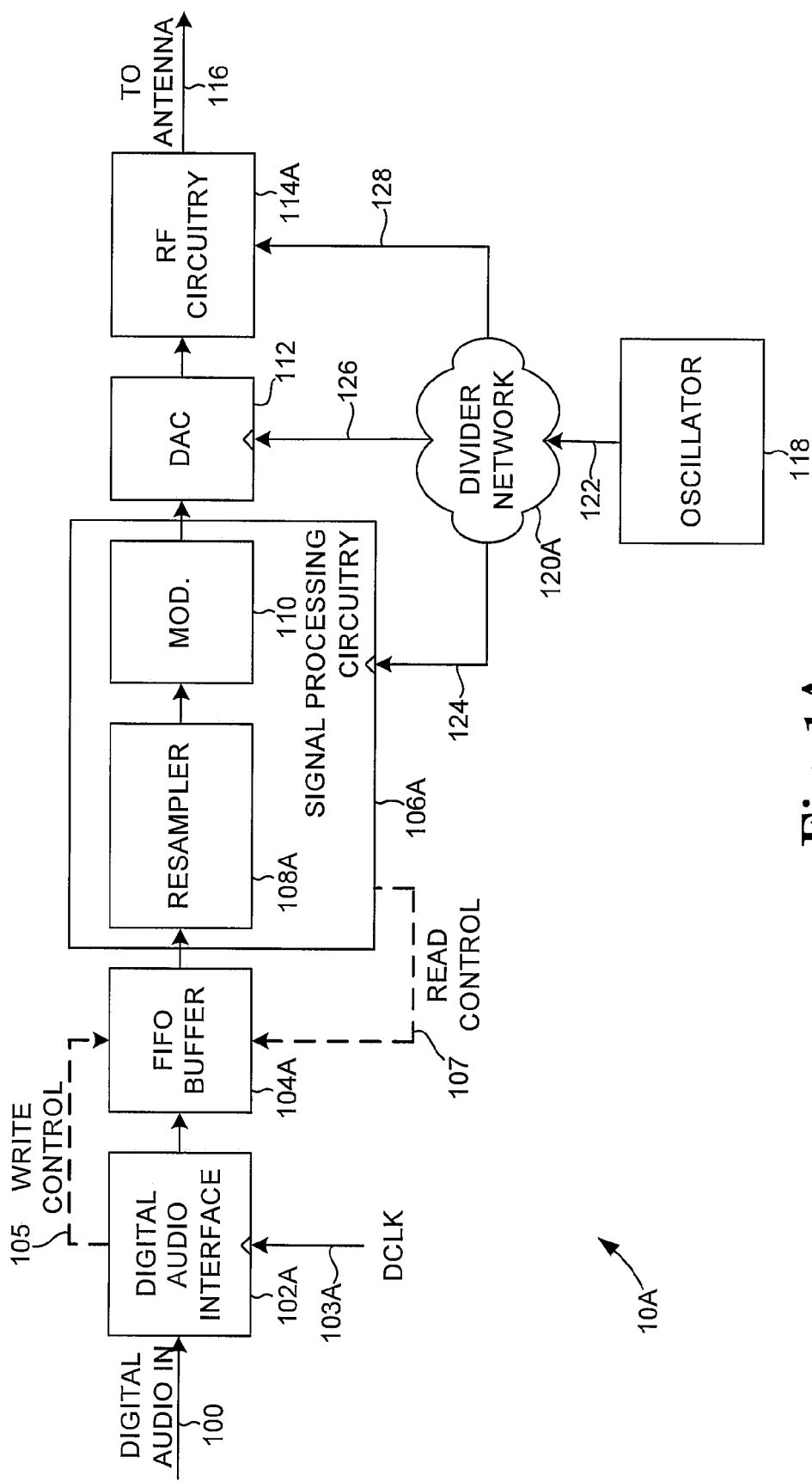
FIGS. 1A-1C are block diagrams illustrating embodiments of communications devices.
Figure 1B:
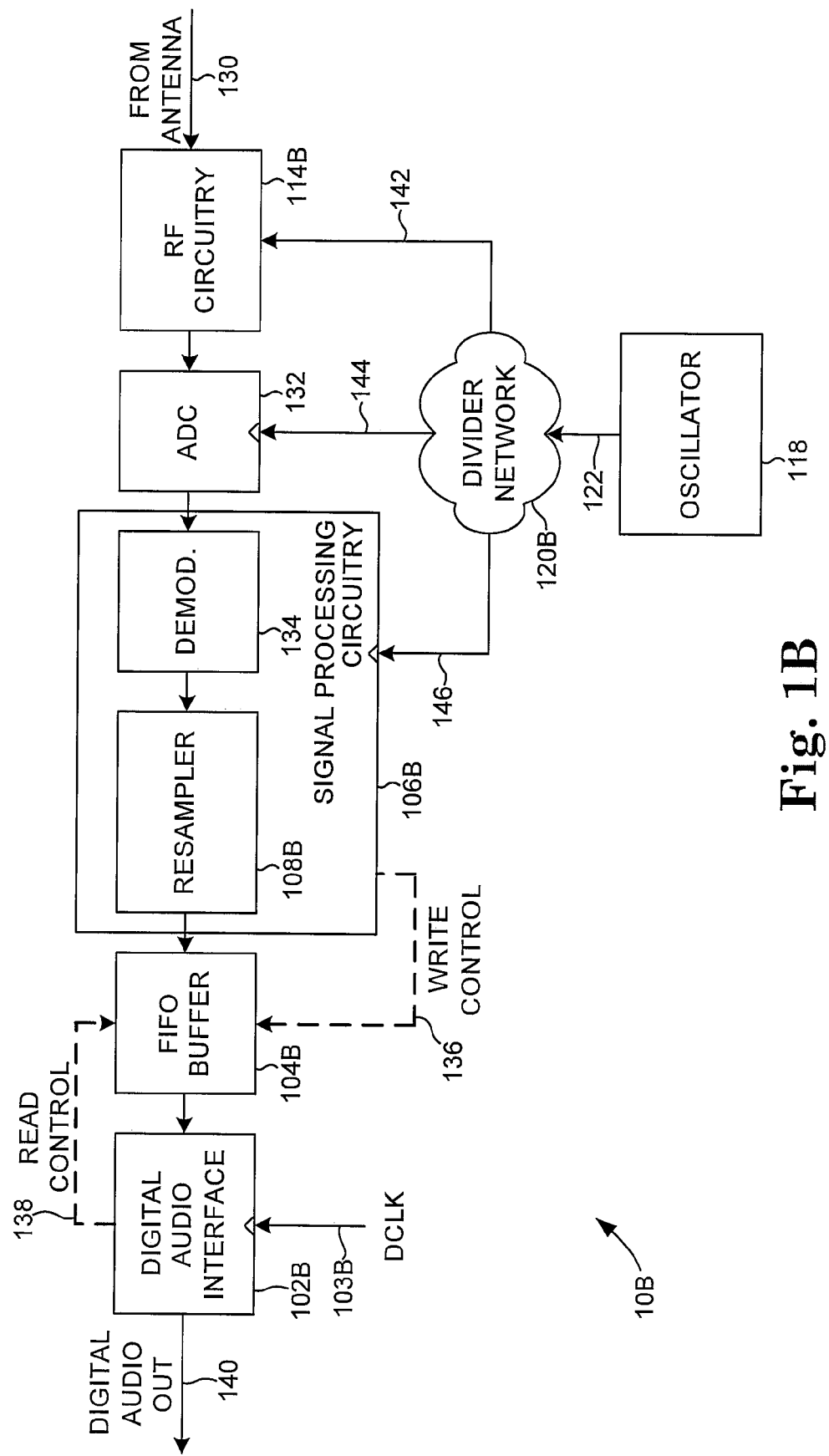
Figure 1C:
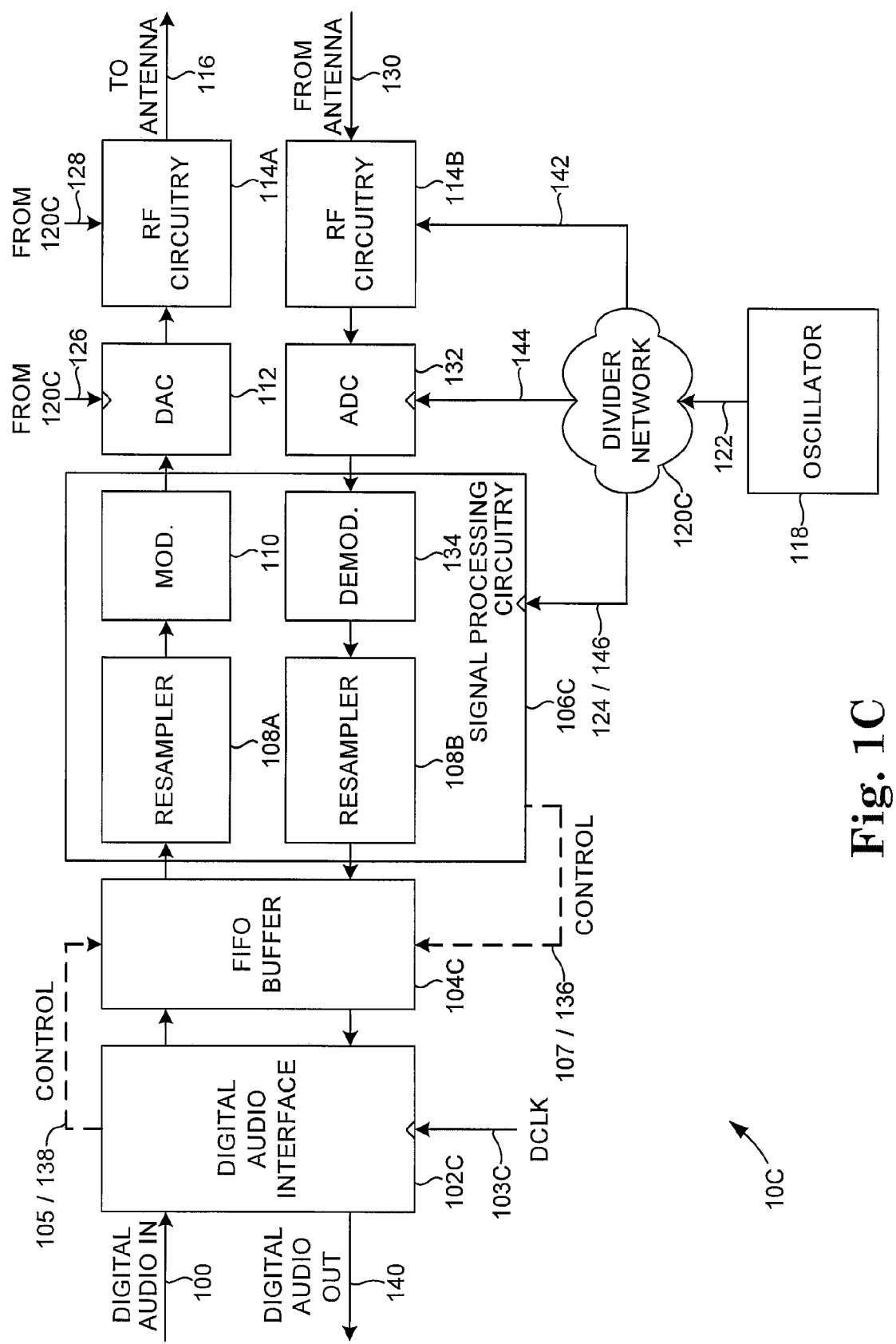

FIGS. 1A-1C are block diagrams illustrating embodiments 10A, 10B, and 10C of communications devices configured to perform adaptive asynchronous sample rate conversion between different input and output sample rates. Communications devices 10A, 10B, and 10C are also configured to track any frequency variation between input and output sampling clocks corresponding to the input and output sample rates, respectively.

In the embodiment of FIG. 1A, communications device 10A forms a transmitter configured to receive digital audio input signals 100 at an input sample rate that is synchronous to an input clock signal 103A (DCLK) and transmit analog audio signals 116, such as analog RF audio signals, corresponding to digital signals 100 across an antenna (not shown in FIG. 1A). Communications device 10A forms analog audio signals 116 from digital signals from a digital-to-analog converter (DAC) 112 with an output sample rate that is synchronous to a reference clock signal 122 generated by a oscillator 118 and asynchronous to input clock signal 103A.

A digital audio interface 102A receives digital audio input signals 100 where digital audio input signals 100 form a continuous stream of digital audio samples (e.g., 16-bit input samples). Digital audio interface 102A stores the samples in a first-in-first-out (FIFO) buffer 104A synchronously with input clock signal 103A using a write control signal 105. Digital audio interface 102A receives digital audio input signals 100 at an input sample rate determined by input clock signal 103A. The input sample rate may be between 32 and 48 kilosamples per second, for example. Input clock signal 103A may be provided to digital audio interface 102A from a host device or other clock source that is external to communications device 10A (not shown) or may be generated within communications device 10A. Digital audio input signals 100 may include left (L) and right (R) audio input channels (not shown).

In one embodiment, digital audio interface 102A forms an Integrated Interchip Sound (I²S) interface configured to connect to an I²S bus as defined by the I²S Bus Specification available from NXP Semiconductors at http://www.nxp.com/acrobat_download/various/I2SBUS.pdf. In this embodiment, clock signal 103A represents the serial clock (SCK) defined by the I²S Bus Specification.

Signal processing circuitry 106A provides a read control signal 107 to FIFO buffer 106A to receives the samples formed from digital audio input signals 100 from FIFO 106A. A resampler 108A in signal processing circuitry 106A performs adaptive asynchronous sample rate conversion on digital audio input signals 100 to generate resampled digital audio signals at an output sample rate that is synchronous to reference clock signal 122. Because reference clock signal 122 and input clock signal 103A are asynchronous, the output sample rate differs from the input sample rate of digital audio input signals 100.

Resampler 108A generates the resampled digital audio signals at an output sample rate determined from a clock signal 124. A divider network 120A receives reference clock signal 122 from a oscillator 118, generates clock signal 124 from reference clock signal 122 at frequencies set by divider network 120A, and provides clock signal 124 to signal processing circuitry 106A. Resampler 108A generates resampled digital audio signals at an output sample rate that is synchronized with clock signal 124. The output sample rate may be approximately 64 kilosamples per second +/−3%, for example. Resampler 108A also tracks any frequency variation between input clock signal 103A and clock signal 124 in the process of generating the resampled digital audio signals.

Resampler 108A provides the resampled digital audio signals to a modulator 110. In one embodiment, modulator 110 performs FM modulation and stereo encoding on the resampled digital audio signals for FM broadcast. In another embodiment, modulator 110 performs AM modulation on the digital signals. In other embodiments, modulator 110 performs other types of modulation on the resampled digital audio signals. Processing circuitry 106A may also perform other suitable audio processing on digital signals 100 such as upsampling or signal conditioning (e.g., tone, amplitude, or compression). Processing circuitry 106A provides the processed signals to DAC 112.

DAC 112 receives the processed signals from processing circuitry 106A, converts the processed signals to analog signals using a clock signal 126 generated by divider network 120A from reference clock signal 122, and provides the analog signals to RF circuitry 114A.

RF circuitry 114A receives the analog signals from DAC 112, generates analog RF output signals 116, and provides analog RF output signals 116 to an antenna (not shown in FIG. 1A) for transmission. In one embodiment, RF circuitry 114A includes a mixer (not shown) configured to upconvert the analog signals from DAC 112 to a desired output (transmit) frequency by combining the analog signals with phase shifted local oscillator mixing signals 128 generated from reference clock signal 122 by divider network 120A. The mixer combines the real and imaginary signals such that the RF signals form real RF signals. RF circuitry 114A may filter the RF signals from the mixer to remove undesired signals and adjust a signal level, i.e. amplitude, of the RF signal to a desired level. RF circuitry 114A provides analog RF output signals 116 for transmission across antenna 106 (shown in FIG. 1).

Communications device 10A may optionally include digital intermediate frequency (IF) conversion circuitry (not shown) configured to upconvert the processed signals signal processing circuitry 106A to an intermediate frequency and provide the upconverted signals to DAC 112. Digital IF conversion circuitry may upconvert the processed signals to produce a quadrature output with real (I) and imaginary (Q) signals.

The digital IF conversion circuitry may in part mix a target channel within an input signal spectrum down to a fixed IF frequency, or down to a variable IF frequency, that is equal to or below about three channel widths. For example, for FM broadcasts within the United States, the channel widths are about 200 kHz. Thus, broadcast channels in the same broadcast area are specified to be at least about 200 kHz apart. For the purposes of this description, therefore, a low IF frequency for FM broadcasts within the United States would be an IF frequency equal to or below about 600 kHz. It is further noted that for spectrums with non-uniform channel spacings, a low IF frequency would be equal to or below about three steps in the channel tuning resolution of the receiver circuitry. For example, if the receiver circuitry were configured to tune channels that are at least about 100 kHz apart, a low IF frequency would be equal to or below about 300 kHz. The IF frequency may be fixed at a particular frequency or may vary within a low IF range of frequencies.

In addition to digital audio input signals 100, communications device 10A may also be configured to receive analog input signals (not shown) and may include one or more analog-to-digital converters (not shown) configured to convert the analog audio input signals to digital signals and provide the digital signals to signal processing circuitry 106A.

In communications device 10A, digital audio interface 102A, FIFO buffer 104A, signal processing circuitry 106A, DAC 112, RF circuitry 114A, and divider network 120A are located on-chip and are at least partially integrated on the same integrated circuit (i.e., on a single chip that is formed on a common substrate) according to one embodiment. Oscillator 118 is located off-chip (i.e., external to the common substrate that includes communications device 10A). In other embodiments, oscillator 118 may be included on-chip.

In the embodiment of FIG. 1B, communications device 10B forms a receiver configured to receive analog audio signals 130, such as analog RF audio signals, from an antenna (not shown in FIG. 1B) and provides output samples (e.g., 16-bit output samples) in the form of digital audio output signals 140 at an output sample rate that is synchronous to an output clock signal 103B (DCLK). Communications device 10B converts the analog audio signals 130 to digital signals with an input sample rate that is synchronous to reference clock signal 122 generated by oscillator 118 and asynchronous to output clock signal 103B.

RF circuitry 114B receives analog signals 130 from an antenna (not shown in FIG. 1B). In one embodiment, RF circuitry 114B includes a low noise amplifier (LNA) (not shown) that amplifies analog signals 130 and a mixer (not shown) that generates real (I) and imaginary (Q) output signals by mixing the amplified signals with phase shifted local oscillator mixing signals 142 generated from reference clock signal 122 by divider network 120B. The outputs of the mixer are at a low-IF. RF circuitry 114B provides the mixed signals to an analog-to-digital converter (ADC) 132.

ADC 132 receives the mixed signals from RF circuitry 114B, converts the analog mixed signals to digital signals at an input sample rate that is synchronous to reference clock signal 122. In particular, ADC 132 converts the analog mixed signals to digital signals at an input sample rate determined from a clock signal 144 generated from reference clock signal 122 by divider network 120B, and provides the digital signals to signal processing circuitry 106B. The input sample rate may be approximately 64 kilosamples per second +/−3%, for example.

Signal processing circuitry 106B receives the digital signals from ADC 132 at the input sample rate and optionally performs digital filtering and digital signal processing to further tune and extract the signal information from the digital signals. In one embodiment, a demodulator 134 performs FM demodulation and stereo decoding on the digital signals and provides the demodulated signals to a resampler 108B. In another embodiment, demodulator 134 performs AM demodulation on the digital signals. In other embodiments, demodulator 134 performs other types of demodulation on the digital signals. Processing circuitry 106B may also perform other suitable audio processing on the digital signals such as upsampling or signal conditioning (e.g., tone, amplitude, or compression).

Resampler 108B performs adaptive asynchronous sample rate conversion on the digital signals from ADC 132 to generate resampled digital audio signals at an output sample rate that is synchronous to output clock signal 103B. Because reference clock signal 122 and output clock signal 103B are asynchronous, the input sample rate differs from the output sample rate of digital audio output signals 140.

Resampler 108B generates the resampled digital audio signals at an output sample rate determined output clock signal 103B. Resampler 108B also tracks any frequency variation between clock signal 146 and output clock signal 103B in the process of generating the resampled digital audio signals. Signal processing circuitry 108B provides the resampled digital audio signals to a first-in-first-out (FIFO) buffer 104B using a write control signal 136.

A digital audio interface 102B accesses the resampled digital audio signals from FIFO buffer 104B using a read control signal 138 that is synchronous with output clock signal 103B. Digital audio interface 102B outputs the resampled digital audio signals as digital audio output signals 140 at an output sample rate determined by output clock signal 103B. The output sample rate may be between 32 and 48 kilosamples per second, for example. Output clock signal 103B may be provided to digital audio interface 102 B from a host device or other clock source external to communications device 10B (not shown) or generated within communications device 10B. Digital audio output signals 140 may include left (L) and right (R) audio input channels (not shown) that represent the content of the FM broadcast channel being tuned.

In one embodiment, digital audio interface 102B forms an Integrated Interchip Sound ($I^2S$) interface configured to connect to an $I^2S$ bus as defined by the $I^2S$ Bus Specification. In this embodiment, clock signal 103B represents the serial clock (SCK) defined by the $I^2S$ Bus Specification.

In addition to digital audio output signals 140, communications device 10B may also provide analog output signals (not shown) and include one or more digital-to-analog converters (not shown) configured to convert the digital audio output signals to analog signals.

In communications device 10B, digital audio interface 102B, FIFO buffer 104B, signal processing circuitry 106B, ADC 132, RF circuitry 114B, and divider network 120B are located on-chip and are at least partially integrated on the same integrated circuit (i.e., on a single chip that is formed on a common substrate) according to one embodiment. Oscillator 118 is located off-chip (i.e., external to the common substrate that includes communications device 10A). In other embodiments, oscillator 118 may be included on-chip.

In the embodiment of FIG. 1C, communications device 10C forms a transceiver that combines the embodiment of the transmitter of FIG. 1A with the embodiment of the receiver of FIG. 1B. Digital audio interface 102C combines the features of digital audio interface 102A (shown in FIG. 1A) and digital audio interface 102B (shown in FIG. 1B) to receive digital audio input signals 100 and provide digital audio output signals 140. FIFO buffer 104C combines the features of FIFO buffer 104A (shown in FIG. 1A) and FIFO buffer 104B (shown in FIG. 1B), and signal processing circuitry 106C combines the features of signal processing circuitry 106A (shown in FIG. 1A) and signal processing circuitry 106B (shown in FIG. 1B).

In a transmit mode of operation, communications device 10C is configured to receive digital audio input signals 100 and transmit analog signals 116 across an antenna (not shown in FIG. 1C) as described above with reference to FIG. 1A. Digital audio interface 102C receives digital audio input signals 100 and store signals 100 in FIFO buffer 104C. Signal processing circuitry 106C accesses signals 100 from FIFO buffer 104C and provides resampled and modulated digital output signals to DAC 112. DAC 112 converts the digital signals from signal processing circuitry 106C to analog signals and provides the analog signals to RF circuitry 114A. RF circuitry 114A generates analog signals 116 and provides analog signals 116 to the antenna.

In a receive mode of operation, communications device 10C is configured to receive analog signals 130 from an antenna and provide digital audio output signals 140 as described above with reference to FIG. 1B. RF circuitry 114B receives analog signals 130 from the antenna and provides analog signals 130 to ADC 132. ADC 132 converts analog signals 130 to digital signals and provide the digital signals to signal processing circuitry 106C. Signal processing circuitry 106C receives the digital signals from ADC 132 and provides demodulated and resampled digital output signals to FIFO buffer 104C. Digital audio interface 102C accesses the digital output signals from FIFO buffer 104C and provides digital audio output signals 140.

Communications device 10C may include antenna switch circuitry (not shown) to allow communications device 10C to selectively operate in the receive and transmit modes of operation at different times.

In the embodiments of FIGS. 1A-1C, oscillator 118 may be a voltage-controlled oscillator that is set to generate reference clock signal 122 at a frequency that depends on the tuning frequency of RF circuitry 114A and/or RF circuitry 114B.

As used herein, an RF signal means an electrical signal conveying useful information and having a frequency from about 3 kilohertz (kHz) to thousands of gigahertz (GHz), regardless of the medium through which the signal is conveyed. Thus, an RF signal may be transmitted through air, free space, coaxial cable, and/or fiber optic cable, for example.

For purposes of illustration, the output signals of communications devices 10A and 10C described herein may be transmitted in signal bands such as AM audio broadcast bands, FM audio broadcast bands, television audio broadcast bands, weather channel bands, or other desired broadcast bands. The input signals of communications devices 10B and 10C described herein may be received in signal bands such as AM audio broadcast bands, FM audio broadcast bands, television audio broadcast bands, weather channel bands, or other desired broadcast bands. The following table provides example frequencies and uses for various broadcast bands that may be transmitted or received by communications devices 10A, 10B, and 10C.

TABLE 1

EXAMPLE FREQUENCY BANDS AND USES

| FREQUENCY | USES/SERVICES |
|---|---|
| 150-535 kHz | European LW radio broadcast |
| | 9 kHz spacing |
| 535-1700 kHz | MW/AM radio broadcast |
| | U.S. uses 10 kHz spacing |
| | Europe uses 9 kHz spacing |
| 1.7-30 MHz | SW/HF international radio broadcasting |
| 46-49 MHz | Cordless phones, baby monitors, remote control |
| 59.75 (2) MHz | U.S. television channels 2-6 (VHF_L) |
| 65.75 (3) MHz | 6 MHz channels at 54, 60, 66, 76, 82 |
| 71.75 (4) MHz | Audio carrier is at 5.75 MHz (FM MTS) |
| 81.75 (5) MHz | |
| 87.75 (6) MHz | |
| 47-54 (E2) MHz | European television |
| 54-61 (E3) MHz | 7 MHz channels, FM sound |
| 61-68 (E4) MHz | Band I: E2-E4 |
| 174-181 (E5) MHz | Band II: E5-E12 |
| 181-188 (E6) MHz | |
| 188-195 (E7) MHz | |
| 195-202 (E8) MHz | |
| 202-209 (E9) MHz | |
| 209-216 (E10) MHz | |
| 216-223 (E11) MHz | |
| 223-230 (E12) MHz | |
| 76-91 MHz | Japan FM broadcast band |
| 87.9-108 MHz | U.S./Europe FM broadcast band |
| | 200 kHz spacing (U.S.) |
| | 100 kHz spacing (Europe) |
| 162.550 (WX1) MHz | U.S. Weather Band |
| 162.400 (WX2) MHz | 7 channels, 25 kHz spacing |
| 162.475 (WX3) MHz | SAME: Specific Area Message Encoding |
| 162.425 (WX4) MHz | |
| 162.450 (WX5) MHz | |
| 162.500 (WX6) MHz | |
| 162.525 (WX7) MHz | |
| 179.75 (7) MHz | U.S. television channels 7-13 (VHF_High) |

TABLE 1-continued

EXAMPLE FREQUENCY BANDS AND USES

| FREQUENCY | USES/SERVICES |
|---|---|
| | 6 MHz channels at 174, 180, 186, 192, 198, 204, 210 |
| 215.75 (13) MHz | FM Sound at 5.75 MHz |
| 182.5 (F5) MHz | French television F5-F10 Band III |
| | 8 MHz channels |
| 224.5 (F10) MHz | Vision at 176, 184, 192, 200, 208, 216 MHz |
| | AM sound at +6.5 MHz |
| 470-478 (21) MHz | Band IV - television broadcasting |
| | Band V - television broadcasting |
| 854-862 (69) MHz | 6 MHz channels from 470 to 862 MHz |
| | U.K. System I (PAL): |
| | Offsets of +/− 25 kHz may be used to alleviate co-channel interference |
| | AM Vision carrier at +1.25 (Lower Sideband vestigial) |
| | FMW Sound carrier at +7.25 |
| | Nicam digital sound at +7.802 |
| | French System L (Secam): |
| | Offsets of +/− 37.5 kHz maybe used |
| | AM Vision carrier at +1.25 (inverted video) |
| | FMW Sound carrier at +7.75 |
| | Nicam digital sound at +7.55 |
| 470-476 (14) MHz | U.S. television channels 14-69 |
| | 6 MHz channels |
| 819-825 (69) MHz | Sound carrier is at 5.75 MHz (FM MTS) |
| | 14-20 shared with law enforcement |

Figure 2A:
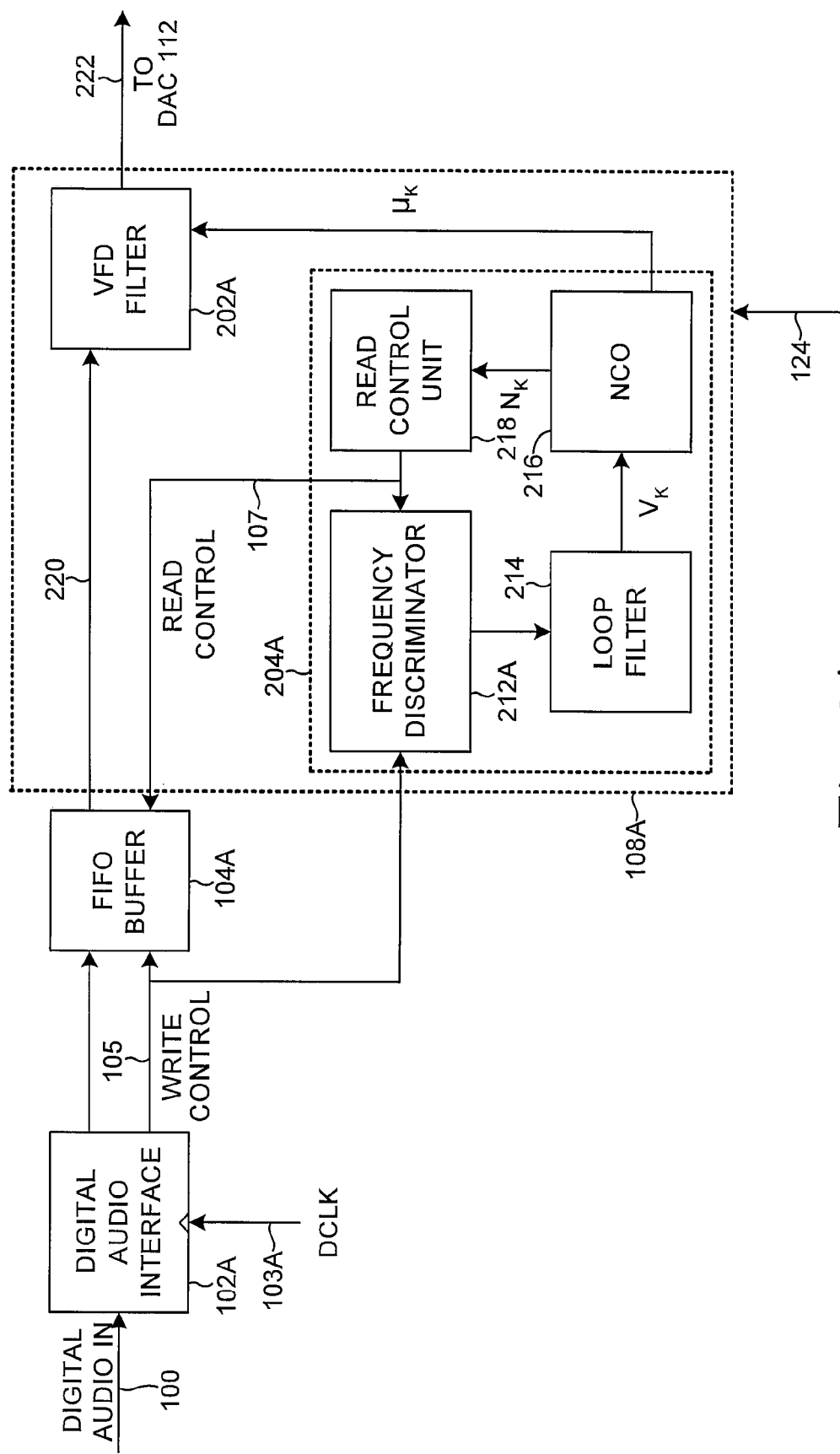
FIGS. 2A-2B are block diagrams illustrating embodiments of resamplers in communications devices.

FIG. 2A is a block diagram illustrating an embodiment of resampler 108A in communications devices 10A and 10C. Resampler 108A includes a variable fractional delay (VFD) filter 202A and a frequency locked loop 204A. Frequency locked loop 204A includes a frequency discriminator 212A, a loop filter 214, a fractional delay numerically controlled oscillator (NCO) 216, and a read control unit 218.

As described above with reference to FIG. 1A, input samples formed from digital audio input signal 100 are stored in FIFO buffer 104A at an input sample rate that is synchronous to input clock signal 103A using write control signal 124. Resampler 108A reads the input samples from FIFO buffer 104A at a rate determined by frequency locked loop 204A using read control signal 107. When frequency locked loop 204A is locked, resampler 108A reads the input samples from FIFO buffer 104A at an average rate that is equal to the input sample rate and generates output samples at an output sample rate that is synchronous with clock signal 124 where divider network 120A generates clock signal 124 synchronously with reference clock signal 122.

VFD filter 202A receives input samples 220 formed from digital audio input signal 100 from FIFO buffer 104A, computes output samples 222 by interpolating input samples 220 at a fractional sample delay time and provides output samples 222 to DAC 112 at an output sample rate that is synchronous with reference clock signal 122. FIG. 3A is a block diagram illustrating model inputs and outputs of VFD filter 202A. VFD filter 202A receives input samples as indicated by x(nT) where n is an integer, T is the input sampling period, and x is a function that represents the audio input levels at sample times nT. VFD filter 202A also receives a fractional sample delay, μ, and an integer sample delay, N. VFD filter 202A generates output samples as indicated by y(nT+NT+μT) where y is the a function that represents the audio output levels.

FIG. 3B is a graphical diagram illustrating input and output sampling instants over a graph 312 of function x(t). As shown in FIG. 3B, input samples occur at each nT and output samples occur at each $NT_O$ where $T_O$ is the output sampling period. FIG. 3C is a diagram illustrating a table 322 with example values used by VFD filter 202A to generate output samples in response to function x(t) in FIG. 3B. Table 322 illustrates an integer delay, $N_K$, the number of samples to read, and a fractional delay, $\mu_K$, for each output index value K.

For example, at output index K=1 (i.e., output sampling instant $T_O$), the integer delay, $N_K$, is 2, the number of samples to read is 2, and the fractional delay, $\mu_K$, is 0.4. For output index K=1, VFD filter 202A receives two input samples and computes an interpolated output sample for time $T_O$, using an integer delay, $N_K$, of 2 and a fractional delay, $\mu_K$, of 0.4. At output index K=2 (i.e., output sampling instant $2T_O$), the integer delay, $N_K$, is 4, the number of samples to read is 2, and the fractional delay, $\mu_K$, is 0.8. For output index K=2, VFD filter 202A receives two input samples and computes an interpolated output sample for time $2T_O$, using an integer delay, $N_K$, of 4 and a fractional delay, $\mu_K$, of 0.8. At output index K=3 (i.e., output sampling instant $3T_O$), the integer delay, $N_K$, is 7, the number of samples to read is 3, and the fractional delay, $\mu_K$, is 0.2. For output index K=3, VFD filter 202A receives three input samples and computes an interpolated output sample for time $3T_O$, using an integer delay, $N_K$, of 7 and a fractional delay, $\mu_K$, of 0.2.

Figure 4:
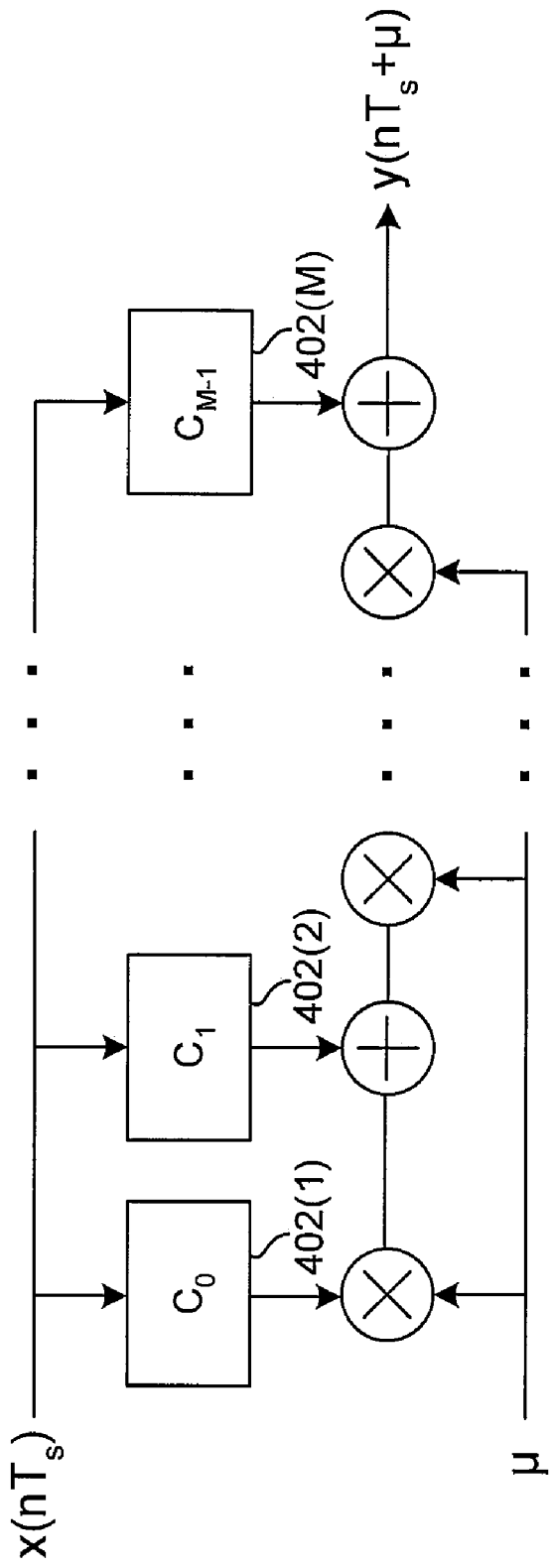
FIG. 4 is a block diagram illustrating one embodiment of a variable fractional delay filter.

In one embodiment, VFD filter 202A forms a Farrow structure as shown in the embodiment of FIG. 4 where VFD filter 202A approximates an ideal interpolator response over a frequency band of interest. In this embodiment, VFD filter 202A includes finite impulse response (FIR) filters 402(1)-402(M), where M is an integer that is the order of the polynomial function formed by VFD filter 202A, with coefficients $C_0$ to $C_{M-1}$, respectively. Each FIR filter 402 includes N+1 taps for receiving input samples 220 where input samples are represented by $x(nT_S)$. The output of each FIR filter 402 is added to the product of the previous FIR filters 402 and the fractional delay, $\mu$, to form output samples as represented by $y(nT_S+\mu)$.

Coefficients $C_0$ to $C_{M-1}$, may be individually determined by minimizing $\delta$ as shown in Equation 1 subject to the condition shown in Equation 2.

$$\delta = \left[ \max_{0 \le \mu \le 1} \left[ \max_{0 \le \omega \le B} \left| \tau(C, \omega, \mu) - \left(\frac{N}{2} - 1 + \mu\right) \right| \right] \right] \quad \text{Equation 1}$$

$$\max_{0 \le \mu \le 1} \left[ \max_{0 \le \omega \le B} \left| |H(C, e^{j\omega}, \mu)| - 1 \right| \right] \le \varepsilon \quad \text{Equation 2}$$

In Equation 1, the term $\tau(C, \omega, \mu)$ represents the phase delay of VFD filter 202A. Using Equation 1, coefficients $C_0$ to $C_{M-1}$ may be determined so that the phase delay response of VFD filter 202A approximates a constant value plus $\mu$ over a frequency band of interest (e.g., 0 to 48 kHz). In Equation 2, the term $H(C, e^{j\omega}, \mu)$ represents the amplitude response of VFD filter 202A. Using Equation 2, coefficients $C_0$ to $C_{M-1}$, may be determined so that the amplitude response of VFD filter 202A approximates unity over a frequency band of interest (e.g., 0 to 48 kHz).

Referring back to FIG. 2A, for each output sample generated by VFD filter 202A, NCO 216 computes the number of input samples 220 to be read from FIFO buffer 104A, $N_K$, and a fractional delay, $\mu_K$, to be applied by VFD filter 202A. NCO 216 provides the number of input samples 220 to be read from FIFO buffer 104A, $N_K$, to read control unit 218 and the fractional delay, $\mu_K$, to VFD filter 202A. NCO 216 determines the number of input samples 220 to be read from FIFO buffer 104A, $N_k$, and the fractional delay, $\mu_K$, from an input parameter, $V_K$, received from loop filter 214 where $V_K$ represents the ratio of the input sample rate to the output sample rate.

Figure 5:
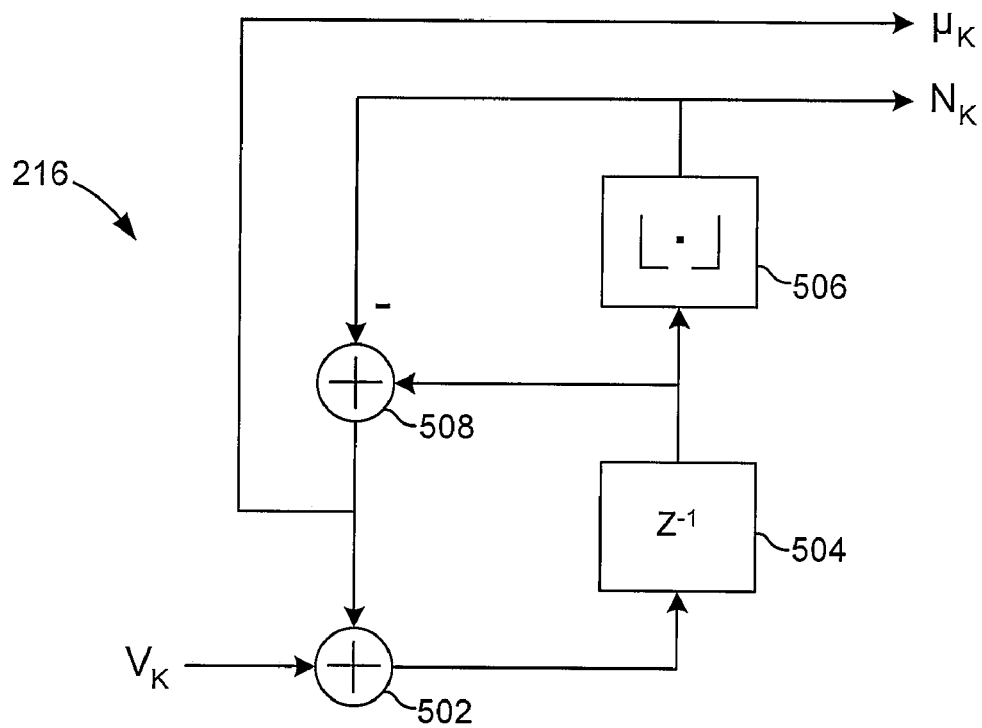
FIG. 5 is a block diagram illustrating one embodiment of a fractional delay numeric controlled oscillator.

FIG. 5 is a block diagram illustrating one embodiment of NCO 216. In the embodiment of FIG. 5, NCO 216 receives the input parameter, $V_K$, and generates the number of input samples 220 to be read from FIFO buffer 104A, $N_K$, and a fractional delay, $\mu_K$, to be applied by VFD filter 202A. The input parameter, $V_K$, is summed with the output of an accumulator 508 by an accumulator 502 and stored by a delay element 504. The output of delay element 506 is provided to a floor function 506 where the fractional portion is removed to determine the number of input samples 220 to be read, $N_K$. Accumulator 508 subtracts the output of floor function 506 from the output of delay element 504 to determine the fractional delay, $\mu_K$.

Referring back to FIG. 2A, read control 218 receives the number of input samples 220 to be read from FIFO buffer 104A, $N_k$, generates read control signal 107 according to $N_k$ to cause input samples 220 to be read from FIFO buffer 104A to VFD filter 202A, and provides read control signal 107 to FIFO buffer 104A and frequency discriminator 212A.

Frequency discriminator 212A computes the sampling frequency offset by periodically calculating the difference between the number of samples written to FIFO 104A using write control signal 105 and the number of samples read from FIFO 104A using read control signal 107. In one embodiment, frequency discriminator 212A uses Equation 3 to computes the sampling frequency offset, offset.

$$\text{offset} = \text{mod}(W(K) - W(K-1), 2^M) - \text{mod}(R(K) - R(K-1), 2^M) \quad \text{Equation 3}$$

In Equation 3, mod represents the modulo operator, W(K) and W(K−1) are the write addresses of FIFO buffer 104A at times K and K−1, respectively, $2^M$ is the size of FIFO buffer 104A, and R(K) and R(K−1) are the read addresses of FIFO buffer 104A at times K and K−1, respectively. The sampling frequency offset computed by frequency discriminator 212A is provided to and drives loop filter 214.

Figure 6:
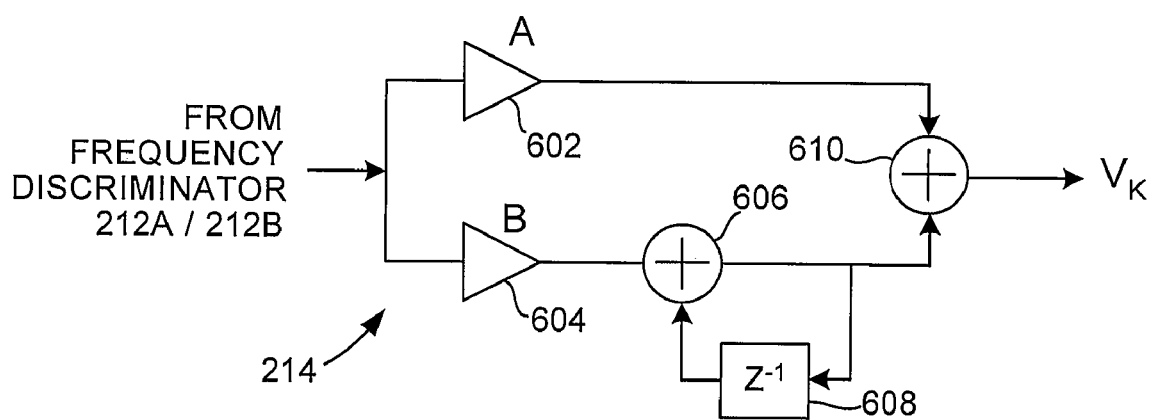
FIG. 6 is a block diagram illustrating one embodiment of a loop filter.

Loop filter 214 tracks the frequency offset between input clock signal 103A and clock signal 124 using the sampling frequency offset computed by frequency discriminator 212A. In one embodiment, loop filter 214 forms a second-order loop filter as shown in FIG. 6. In the embodiment of FIG. 6, amplifiers 602 and 604 apply gains of A and B, respectively to the sampling frequency offset from frequency discriminator 212A. An accumulator 606 sums the output of amplifier 604 with a previous output of accumulator 606 as indicated by a delay element 608. An accumulator 610 sums the output of amplifier 602 with the output of accumulator 606 to generate the parameter $V_K$. In order to speed up the loop convergence of loop filter 214, loop filter accumulator 610 may be initialized with an estimate of the frequency ratio of input clock signal 103A and clock signal 124.

In one embodiment, resampler 108A may be implemented as a program product with a set of instructions executable by signal processing circuitry 106A Accordingly, resampler 108A may be stored in any suitable storage media that is accessible to signal processing circuitry 106A. The storage media may be within or external to signal processing circuitry 106A. In other embodiments, resampler 108A may be implemented with hardware components or a combination of hardware and software components.

Figure 2B:
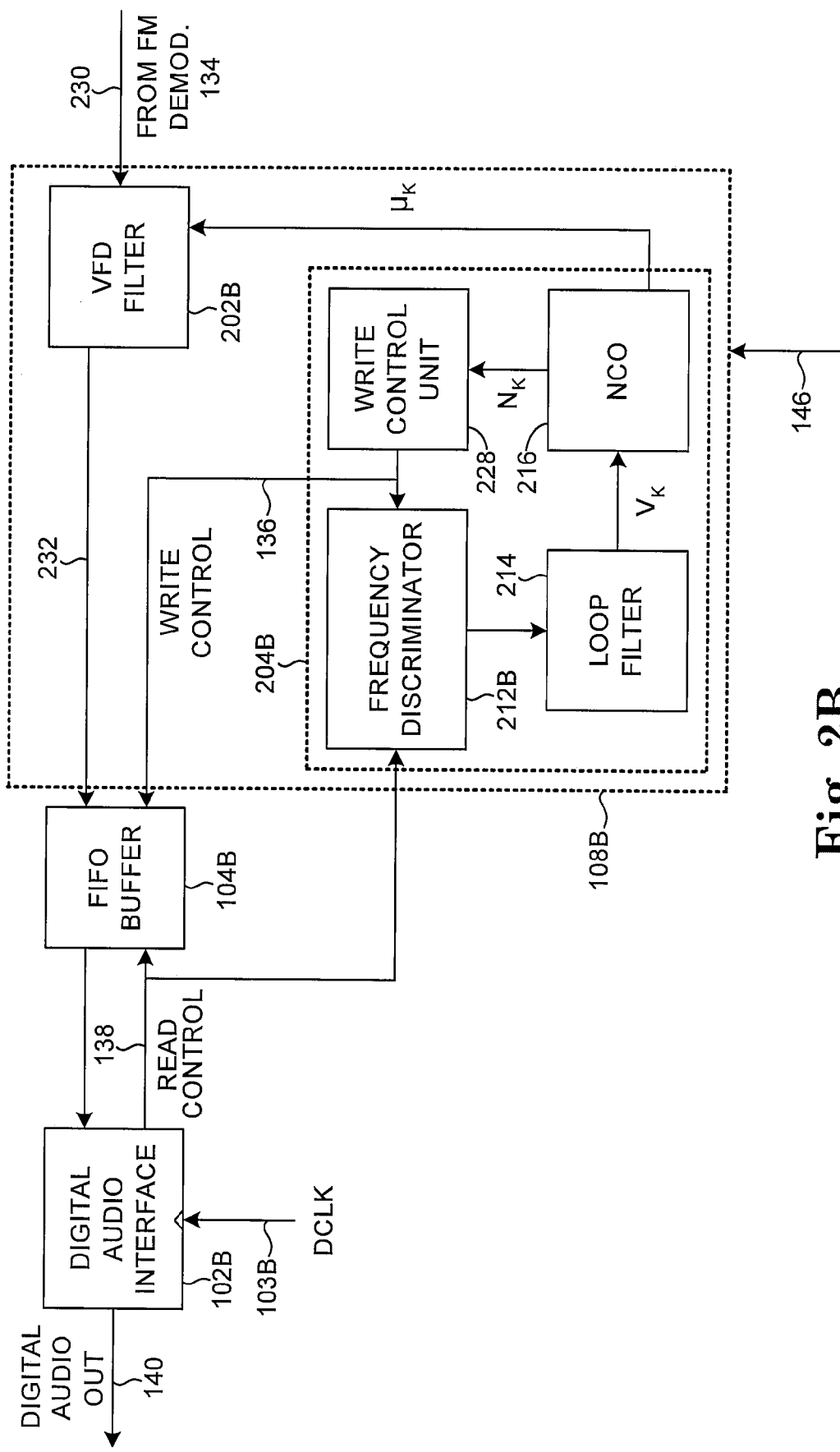

FIG. 2B is a block diagram illustrating an embodiment of resampler 108B in communications devices 10B and 10C. Resampler 108B includes a variable fractional delay filter 202B and a frequency locked loop 204B. Frequency locked loop 204B includes a frequency discriminator 212B, loop filter 214, numerically controlled oscillator (NCO) 216, and a write control unit 228.

As described above with reference to FIG. 1B, input samples 230 formed from demodulated signals from demodulator 134 are provided to resampler 108B at an input sample rate that is synchronous to clock signal 144. Resampler 108B generates output samples at an output sample rate that is synchronous with output clock signal 103B and writes the output samples to FIFO buffer 104B at a rate determined by frequency locked loop 204B using write control signal 136. When frequency locked loop 204B is locked, resampler 108B writes the output samples to FIFO buffer 104B at an average rate that is equal to the output sample rate. Digital audio interface 102B reads the output samples from FIFO buffer 104B synchronous with output clock signal 103B using read control signal 138.

VFD filter 202B receives input samples 230 from demodulator 134, computes output samples 232 by interpolating input samples 230 at a fractional sample delay time, and provides output samples 232 to FIFO buffer 104B at an output sample rate that is synchronous with output clock signal 103B. VFD filter 202B operates as described above for VFD filter 202A with reference to FIGS. 3A-3C and 4 in one embodiment.

For each output sample generated by VFD filter 202B, NCO 216 computes the number of output samples 232 to be written to FIFO buffer 104B, $N_K$, and a fractional delay, $\mu_K$, to be applied by VFD filter 202B. NCO 216 provides the number of output samples 232 to be written to FIFO buffer 104B, $N_K$, to write control unit 228 and the fractional delay, $\mu_K$, to VFD filter 202B. NCO 216 determines the number of output samples 232 to be written to FIFO buffer 104B, $N_k$, and the fractional delay, $\mu_K$, from an input parameter, $V_K$, received from loop filter 214 where $V_K$ represents the ratio of the input sample rate to the output sample rate.

Write control 228 receives the number of output samples 232 to be written to FIFO buffer 104B, $N_k$, generates write control signal 136 according to $N_k$ to cause output samples 232 to be read written to FIFO buffer 104B by VFD filter 202B, and provides write control signal 136 to FIFO buffer 104B and frequency discriminator 212B.

Frequency discriminator 212B computes the sampling frequency offset by periodically calculating the difference between the number of samples written to FIFO 104B using write control signal 136 and the number of samples read from FIFO 104B using read control signal 138. In one embodiment, frequency discriminator 212B uses Equation 3 above to computes the sampling frequency offset, offset.

Loop filter 214 tracks the frequency offset between output clock signal 103B and clock signal 146 using the sampling frequency offset computed by frequency discriminator 212B. Referring to FIG. 6, loop filter accumulator 610 may be initialized with an estimate of the frequency ratio of input clock signal 103B and clock signal 146 in order to speed up the loop convergence of loop filter 214.

In one embodiment, resampler 108B may be implemented as a program product with a set of instructions executable by signal processing circuitry 106B Accordingly, resampler 108B may be stored in any suitable storage media that is accessible to signal processing circuitry 106B. The storage media may be within or external to signal processing circuitry 106B. In other embodiments, resampler 108B may be implemented with hardware components or a combination of hardware and software components.

In other embodiments of resamplers 108A and 108B, frequency discriminators 212A and 212B may be replaced with frequency counters (not shown) that count input clock signal 103A and output clock signal 103B, respectively, over a time period to track frequency variations between reference clock signal 122 and clock signals 103A and 103B, respectively.

Figure 7:
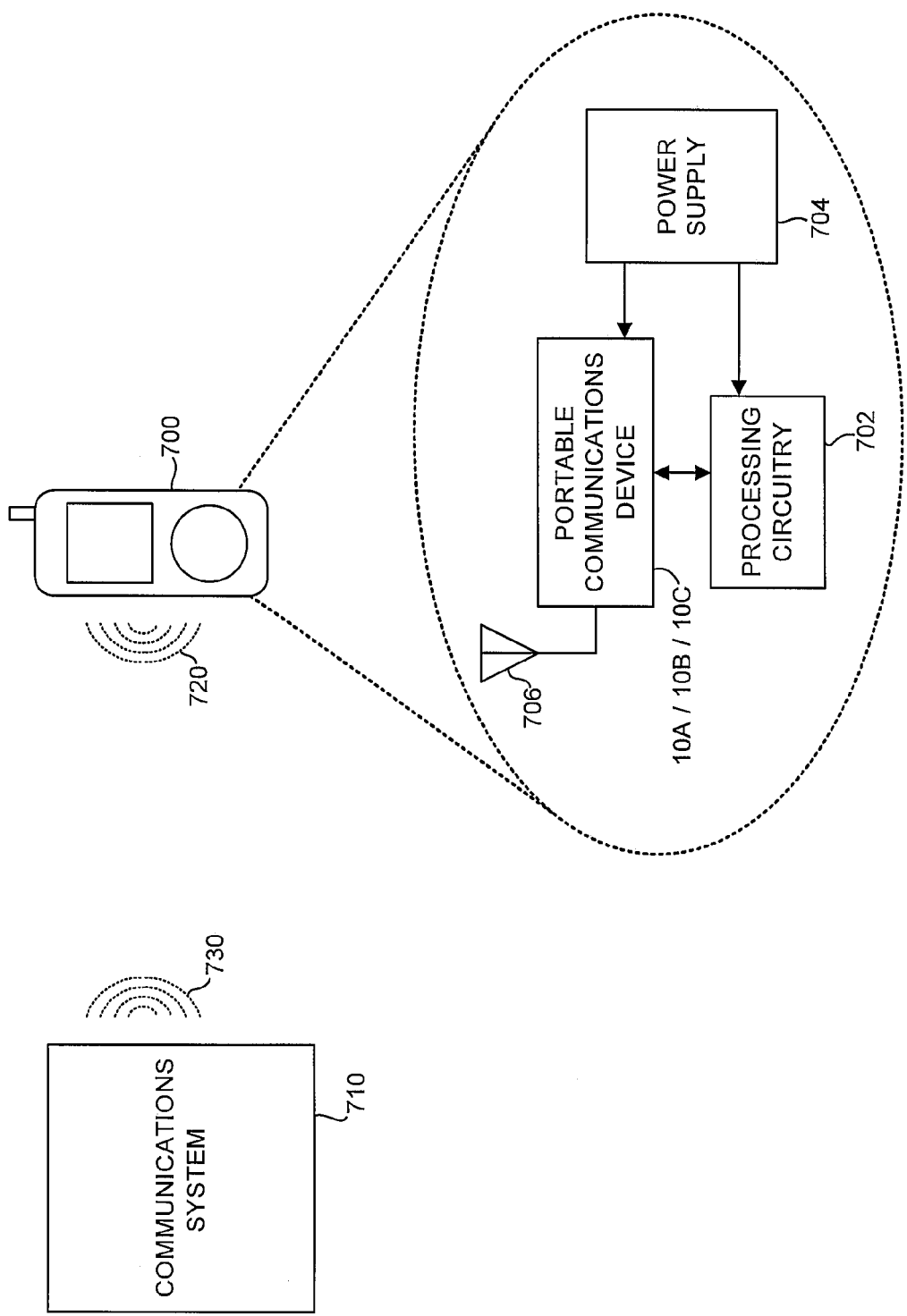
FIG. 7 is a block diagram illustrating one embodiment of a portable communications system that includes a communications device.

FIG. 7 is a block diagram illustrating one embodiment of a portable communications system 700 that includes communications device 10A (as shown in FIG. 1A), communications device 10B (as shown in FIG. 1B), or communications device 10C (as shown in FIG. 1C). Portable communications system 700 may be any type of portable or mobile communications device such as a mobile or cellular telephone, a personal digital assistant (PDA), an audio and/or video player (e.g., an MP3 or DVD player), a wireless telephone, and a notebook or laptop computer. Portable communications system 700 includes communications device 10A, 10B, or 10C, processing circuitry 702, a power supply 704, and an antenna 706 among other components not shown.

Processing circuitry 702 receives information from a user and provides the information to communications device 10A, 10B, or 10C. Processing circuitry 702 also receives information from mobile communications device 10A, 10B, or 10C and provides the information to a user. The information may include voice and/or data communications, audio, video, image, or other graphical information. Processing circuitry 702 includes any number and types of input and/or output devices to allow a user provide information to and receive information from portable communications system 700. Examples of input and output devices include a microphone, a speaker, a keypad, a pointing or selecting device, and a display device.

Power supply 704 provides power to portable communications system 700 and input/output system 702. Power supply 704 includes any suitable portable or non-portable power supply such as a battery or an AC plug.

Communications system 700 communicates with communications system 710 or other remotely located hosts in radio frequencies using antenna 706. Communications system 700 may transmit information to communications system 710 or other remotely located hosts in radio frequencies as indicated by a signal 720 using antenna 706. Communications system 700 may also receive information from communications system 710 or other remotely located hosts in radio frequencies as indicated by a signal 730 using antenna 706. In other embodiments, communications system 700 communicates with communications system 710 or one or more remotely located hosts using other suitable frequency bands.

In the above embodiments, a variety of circuit and process technologies and materials may be used to implement the communications systems according to the invention. Examples of such technologies include metal oxide semiconductor (MOS), p-type MOS (PMOS), n-type MOS (NMOS), complementary MOS (CMOS), silicon-germanium (SiGe), gallium-arsenide (GaAs), silicon-on-insulator (SOI), bipolar junction transistors (BJTs), and a combination of BJTs and CMOS (BiCMOS).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
   a buffer;
   a feedback loop configured to generate a fractional delay from a ratio of a first number of samples written into the buffer to a second number of samples read from the buffer; and
   a variable fractional delay filter configured to generate an output sample using a plurality of input samples and the fractional delay.

2. The system of claim 1 wherein the variable fractional delay filter is configured to receive the plurality of input samples from the buffer.

3. The system of claim 2 wherein the feedback loop is configured to provide a control signal to the buffer to cause a selected number of the plurality of input samples to be provided to the variable fractional delay filter.

4. The system of claim 1 wherein the variable fractional delay filter is configured to provide the output sample to the buffer.

5. The system of claim 4 wherein the feedback loop is configured to provide a control signal to the buffer to cause the output sample to be provided to the buffer.

6. The system of claim 1 wherein the variable fractional delay filter forms a Farrow structure.

7. The system of claim 1 wherein the feedback loop includes a numerically controlled oscillator configured to generate the fractional delay.

8. The system of claim 7 wherein the feedback loop includes a loop filter configured to provide a signal to the numerically controlled oscillator that represents the ratio.

9. A method performed by an integrated communication device, the method comprising:
   generating a fractional delay from a ratio of a first number of samples written into a buffer synchronously with a first clock signal to a second number of samples read from a buffer synchronously with a second clock signal; and
   generating an output sample using a plurality of input samples and the fractional delay.

10. The method of claim 9 further comprising:
    storing the plurality of input samples from the buffer.

11. The method of claim 9 further comprising:
    storing the output sample into the buffer.

12. The method of claim 9 further comprising:
    generating the output sample with a variable fractional delay filter that forms a Farrow structure.

13. The method of claim 9 wherein the input clock signal and the output clock signal are asynchronous.

14. The method of claim 9 further comprising:
    providing the output sample to RF circuitry.

15. The method of claim 9 further comprising:
    receiving the plurality of input samples from RF circuitry.

16. A communications device comprising
    radio frequency (RF) circuitry configured to interface with an antenna;
    signal processing circuitry coupled to the RF circuitry and including resampler; and
    a buffer;
    wherein the resampler includes a feedback loop configured to generate a fractional delay from a ratio of a first number of samples written into the buffer to a second number of samples read from the buffer and a variable fractional delay filter configured to generate an output sample using a plurality of input samples and the fractional delay.

17. The communications device of claim 16 wherein the signal processing circuitry is configured to provide the output sample to the RF circuitry, and wherein the RF circuitry is configured to generate a radio frequency (RF) signal from the output sample and transmit the RF signal across the antenna.

18. The communications device of claim 16 further comprising:
    an interface configured to receive the plurality of input samples from an external host and store the plurality of input samples into the buffer.

19. The communications device of claim 16 wherein the RF circuitry is configured to generate the plurality of input samples from a radio frequency (RF) signal received across the antenna, and wherein the signal processing circuitry is configured to receive the plurality of input samples from the RF circuitry.

20. The communications device of claim 16 further comprising:
    an interface configured to receive the output sample from the buffer and provide the output sample to an external host.

21. A communications system comprising:
    a communications device including:
       communications circuitry;
       signal processing circuitry coupled to the communication circuitry and including resampler; and
       a buffer;
    an antenna coupled to the communications device; and
    processing circuitry configured to communicate with the communications device;
    wherein the resampler includes a feedback loop configured to generate a fractional delay from a ratio of a first number of samples written into the buffer to a second number of samples read from the buffer and a variable fractional delay filter configured to generate an output sample using a plurality of input samples and the fractional delay.

22. The communications system of claim 21 wherein the communications circuitry includes transmitter circuitry configured to generate a signal from the output sample, and wherein the transmitter circuitry is configured to transmit the signal across the antenna.

23. The communications system of claim 21 wherein the communications circuitry includes receiver circuitry configured to receive a signal across the antenna, and wherein the receiver circuitry is configured to generate the plurality of input samples from the signal.

* * * * *